United States Patent
Eisenhuth

(10) Patent No.: US 11,789,817 B2
(45) Date of Patent: Oct. 17, 2023

(54) ERROR CORRECTION FOR INTERNAL READ OPERATIONS

(71) Applicant: Micron Technology, Inc., Boise, ID (US)

(72) Inventor: Robert B. Eisenhuth, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 222 days.

(21) Appl. No.: 17/240,471

(22) Filed: Apr. 26, 2021

(65) Prior Publication Data

US 2022/0342754 A1 Oct. 27, 2022

(51) Int. Cl.
G06F 11/10 (2006.01)
H03M 13/15 (2006.01)
G06F 11/00 (2006.01)
G06F 3/06 (2006.01)

(52) U.S. Cl.
CPC ........ *G06F 11/1076* (2013.01); *G06F 3/0619* (2013.01); *G06F 3/0659* (2013.01); *G06F 3/0673* (2013.01); *H03M 13/152* (2013.01); *H03M 13/1515* (2013.01)

(58) Field of Classification Search
CPC ............. G06F 11/1048; G06F 11/1076; G06F 3/0619; G06F 3/0659; G06F 3/0673; H03M 13/1515; H03M 13/152
See application file for complete search history.

(56) References Cited

U.S. PATENT DOCUMENTS

| | | | | |
|---|---|---|---|---|
| 5,539,755 A * | 7/1996 | Baggen | ................. | H03M 13/35 714/779 |
| 9,558,066 B2 * | 1/2017 | Bonen | ................. | G06F 11/1004 |
| 9,811,420 B2 * | 11/2017 | Das | ..................... | G06F 11/1084 |
| 10,872,011 B2 * | 12/2020 | Bains | ................. | G11C 11/4093 |
| 2014/0281808 A1 * | 9/2014 | Lam | ..................... | G11C 29/028 714/763 |

* cited by examiner

*Primary Examiner* — Justin R Knapp
(74) *Attorney, Agent, or Firm* — Holland & Hart LLP

(57) ABSTRACT

Methods, systems, and devices for error correction for internal read operations are described. In some memory systems, a memory device may perform an internal read operation, in which the memory device reads data internal to the memory device (e.g., without sending the data to a memory system controller). To detect and correct errors during an internal read operation, the memory device may use an error control circuit on a memory die. The error control circuit on the memory die may operate on the same codeword, including the same data and same parity bits, as an error control circuit at the memory system controller, effectively reusing the stored parity bits for host read operations and internal read operations. To reduce the decoding overhead at the memory device, the error control circuit on the memory die may support detecting fewer errors than the error control circuit at the memory system controller.

24 Claims, 5 Drawing Sheets

ERROR CORRECTION FOR INTERNAL READ OPERATIONS

FIELD OF TECHNOLOGY

The following relates generally to one or more systems for memory and more specifically to error correction for internal read operations.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
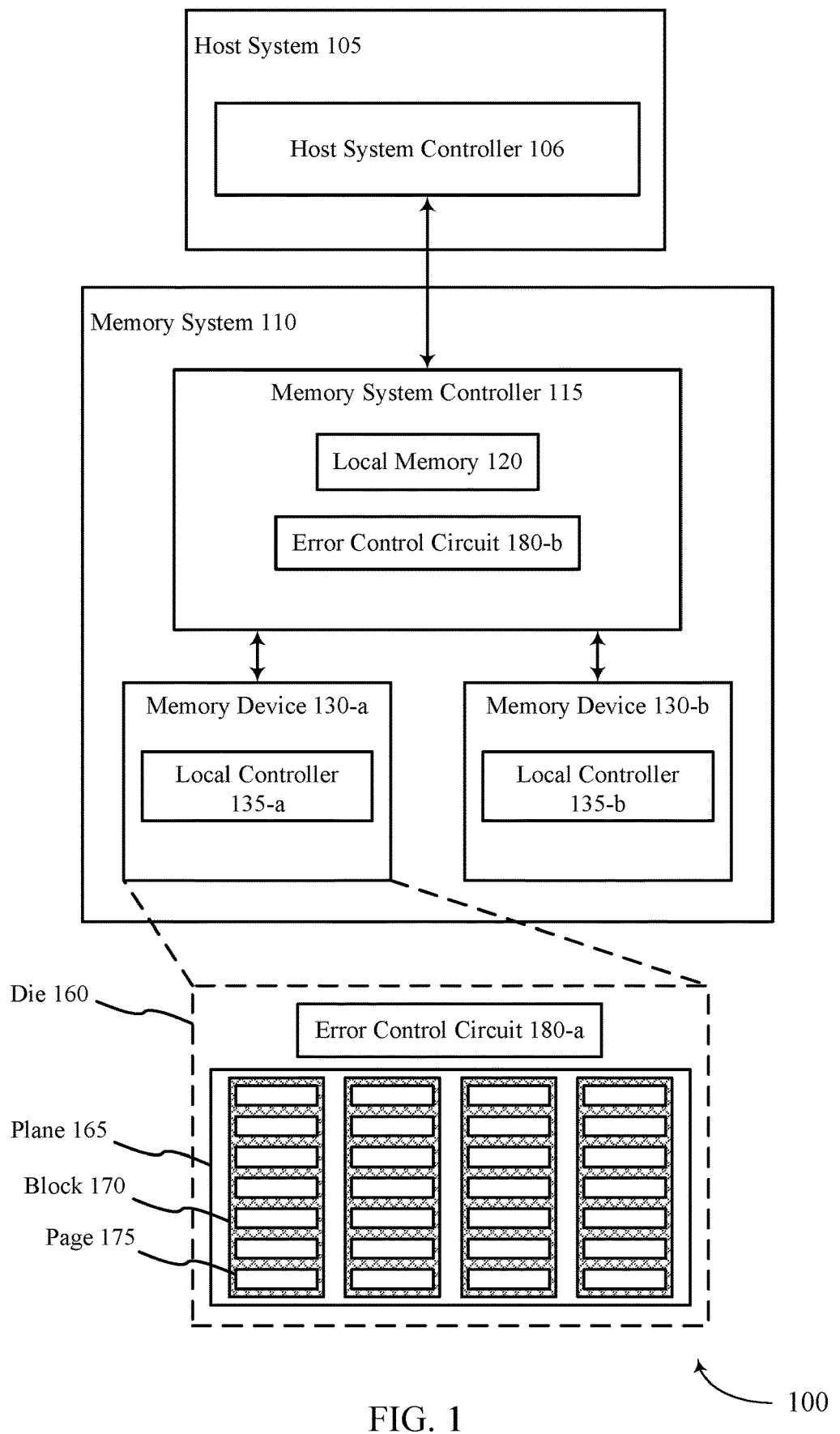
FIG. 1 illustrates an example of a system that supports error correction for internal read operations in accordance with examples as disclosed herein.

Some memory systems may support internal read operations at a memory device. An internal read operation—which, in some cases, may be referred to as a "pre-read"—may involve a memory device reading data from a memory die and writing information back to the memory die without sending the data external to the host system or the memory system (e.g., such as to a memory system controller). A memory device may perform an internal read operation in order to perform at least a portion of a copyback operation, a garbage collection operation, a write operation for a multiple-level memory cell, an iterative write operation, or some combination thereof. In some examples, the memory device may not apply any error control operations during an internal read operation. For example, if error control is handled by an error control circuit at the memory system controller, the data for the internal read operation may not be sent to the error control circuit for error checking. As such, if data read from a memory die by the internal read operation includes one or more errors, the memory device may write data back to the memory die including the error(s). Accordingly, the internal read operation may effectively propagate errors and, in some cases, may fail to detect a transient error and may commit the transient error to the data (e.g., as a "hard" error). In some examples, multiple internal read operations may accumulate errors over time, resulting in unreadable data stored in the memory device.

To support the detection and correction of errors during an internal read operation, a memory device may use an error control circuit on a memory die. The error control circuit may support detecting a first quantity of errors that is less than a second quantity of errors that may be detected by an error control circuit at the memory system controller. For example, to reduce the processing overhead internal to the memory device, the error control circuit on the memory die may use a less complex decoding logic than the error control circuit at the memory system controller. However, to efficiently use the available information stored at the memory die, the error control circuit on the memory die may operate on the same codeword—including the same data and the same parity bits—as the error control circuit at the memory system controller. The error control circuit on the memory die may detect and correct data bits, parity bits, or both for a codeword during an internal read operation. As such, the same codeword may support two levels of error checking: an efficient, relatively low-overhead error control operation on the memory die for internal read operations and a more complex error control operation at the memory system controller for host read operations. Additionally or alternatively, to reduce the likelihood of mis-correction during the error control operation for an internal read, the error control circuit on the memory die may use extra syndromes to determine which bits to correct. For example, although 2T syndromes may support correcting up to T errors, the error control circuit may calculate greater than 2T syndromes to reduce the risk of a mis-correction and improve the reliability of error correction for the internal read operations.

Features of the disclosure are initially described in the context of a system as described with reference to FIG. 1. Features of the disclosure are further described in the context of a process flow and circuits as described with reference to FIGS. 2, 3A, and 3B. These and other features of the disclosure are further illustrated by and described with reference to an apparatus diagram and a flowchart that relate to error correction for internal read operations as described with reference to FIGS. 4 and 5.

FIG. 1 illustrates an example of a system 100 that supports error correction for internal read operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or any combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer).

Each die 160 may include one or more planes 165, and each plane 165 may include a respective set of blocks 170, where each block 170 may include a respective set of pages 175, and each page 175 may include a set of memory cells.

In some examples, a memory device 130 may operate using or according to virtual blocks and virtual pages. A virtual block may correspond to one block 170 of each plane 165 and each NAND die 160. Each virtual block may include multiple virtual pages. In some cases, multiple virtual pages may correspond to a physical page 175 (e.g., four virtual pages per physical page 175). In some examples, a virtual block may include tens of thousands of virtual pages (e.g., depending on the size of the memory device 130). The memory device 130 may perform read and write operations according to the virtual blocks and virtual pages. In some examples, one or more virtual pages, virtual blocks, pages 175, blocks 170, or memory devices 130 may be referred to as a "partition" or a "subset" of a memory system 110.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

Some operations performed at a memory device 130 may involve an internal read operation (e.g., internal to the memory device 130). An internal read operation may involve the memory device 130 pre-reading data written to the memory device 130 prior to writing new data to the memory device 130. The memory device 130 may use the data read during the internal read operation to determine how to write the new data to the memory device 130.

In some examples, a memory device 130 may include a multiple-level memory cell at a memory die 160. If the memory device 130 receives a write command to write data to the multiple-level memory cell, the memory device 130 may perform an internal read operation to read data from a first page 175 of the multiple-level memory cell. For example, if the memory device 130 supports storing multiple bits per cell, the memory device 130 may pre-read a lower page, an upper page, or both to support writing data to an extra page of the memory device 130 with a multi-pass programming algorithm. The memory device 130 may determine how to write the data to the extra page according to the data read from the lower page, the upper page, or both.

In some other examples, a memory device 130 (e.g., 3-dimensional cross-point memory (3D cross point)) may use a write mode, such as Normal Write, that involves an iterative write operation. For example, the memory device 130 may perform an internal read operation to read data from a page 175 prior to writing new data to the page 175. Instead of writing all the new data to the page 175, the memory device 130 may determine which bits change between the data currently stored on the page 175 (e.g., determined using the internal read operation) and the new data to write to the page 175. The memory device 130 may write the bits that are changing and may refrain from writing other bits to reduce a quantity of program-erase (P/E) cycles performed by the memory device 130.

In yet some other examples, a memory device 130 may implement an internal read operation to perform a variety of operations (including a copyback operation). For example, a copyback operation may involve the memory device 130 reading data from a first location in memory (e.g., NAND flash memory) and writing the data to a second location in memory. Garbage collection may be one example of a copyback operation. Another example of a copyback operation may involve the memory device 130 migrating data from one type of memory cell to another. To perform copyback, the memory device 130 may perform the internal read operation to read the data from the first location in memory.

An internal read operation may be performed internal to a memory device 130. For example, the data read from a memory die 160 during an internal read operation may not be sent to any component external to the memory device 130 (e.g., to other components of the memory system 110). The internal read operation may be handled by a local controller 135 of a memory device 130 and not by a memory system controller 115 of the memory system 110. This process may be different from a host read operation (e.g., a read operation performed in response to a read command received from a host system 105). A host read operation may be handled by the memory system controller 115. For example, the memory system 110 may receive a read command from a host system 105, read the requested data from a memory device 130, decode and perform error control operations on the data at the memory system controller 115, and return the requested data to the host system 105 in response to the read command. Accordingly, host read operations may be handled by the memory system controller 115 retrieving data from a memory device 130, while internal read operations may be handled internal to a memory device 130.

For a host read operation, error control handling may be performed at the memory system controller 115. As illustrated in FIG. 1, the memory system controller 115 may include an error control circuit 180-b that performs an error control operation on data read from a memory device 130. The memory system controller 115 may read data from the memory device 130 as a codeword (e.g., an error control code, such as an error-correcting code (ECC)) including data and parity bits. The error control circuit 180-*b* may decode the codeword to determine the data. Using the parity bits and one or more features of an ECC, the error control circuit 180-*b* may detect and correct errors in the data. For example, if a stored bit mistakenly flips between bit values due to one or more conditions (e.g., temperature variations, electrical or magnetic interference), the error control circuit 180-*b* may return the correct bit using the ECC and the decoding logic for the error control circuit 180-*b*. Accordingly, if errors occur in the data stored at a memory device 130, the memory system controller 115 may fix the errors prior to sending the data to a host system 105.

Because internal read operations do not send data to the memory system controller 115, the error control circuit 180-*b* may not perform an error control operation on the internally read data. If no error correction is performed for the internal read operation, any errors in the data for an internal read operation may affect the data written back to the memory device 130. For example, even if an error is transient, the internal read operation may result in the memory device 130 writing the error back to the memory die 160 (e.g., as a "hard" error). In some cases, errors may accumulate over time if multiple internal read operations are performed without error correction.

To provide error correction for internal read operations, a memory device 130 may include an internal error control circuit 180-*a*. The error control circuit 180-*a* may be on the memory die 160 and may provide error control protection for data read during an internal read operation. To support a relatively low processing overhead (e.g., below a threshold value), the correction capability of the error control circuit 180-*a* may be relatively low and, correspondingly, the error control code decoding logic internal to the memory device 130 may be relatively less complex than for the error control circuit 180-*b* at the memory system controller 115. Specifically, because the memory system controller 115 may support more resources for decoding and less-strict latency thresholds than the memory device 130, the error control circuit 180-*b* may support more decoding complexity than the error control circuit 180-*a*. However, storing additional ECC parity bits to support different decoding logic at the error control circuit 180-*a* and the error control circuit 180-*b* may increase storage overhead and inefficiently utilize memory resources of the memory device 130.

The memory device 130 may implement a specific error control circuit 180-*a* such that the error control circuit 180-*a* may reuse the ECC parity bits used by the error control circuit 180-*b* (e.g., despite the difference in decoding logic between the error control circuit 180-*a* and the error control circuit 180-*b*). For example, the memory device 130 may store data using a codeword (e.g., an ECC) that is configured for use by both a first error control circuit 180-*a* supporting detection of a first quantity of errors and a second error control circuit 180-*b* supporting detection of a second quantity of errors.

To support such flexibility between decoding at an error control circuit 180-*a* internal to a memory device 130 and decoding at an error control circuit 180-*b* at a memory system controller 115, the memory system 110 may use a codeword generation process to generate a codeword that is valid for both a relatively large quantity of error corrections (e.g., above a threshold quantity of errors) and a relatively small quantity of error corrections (e.g., below a threshold quantity of errors). Some example codeword types that support such operations may include Bose-Chaudhuri-Hoc-quenghem (BCH) codewords and Reed Solomon codewords, although the memory system 110 may implement any type of codeword that supports these operations. The error control circuit 180-*a* may use a first code (e.g., a relatively small code) to decode the codeword, while the error control circuit 180-*b* may use a second code (e.g., a relatively large code) to decode the same codeword.

The memory system 110 may use a specific first code and second code to support decoding of a same codeword. For example, the first code and the second code may share the same Galois Field primitive polynomial. The Galois Field primitive polynomial may determine an upper limit of a codeword size supported by the codes. For example, a Galois Field of X bits may support BCH codewords including up to $2^X-1$ bits. Both decoders (e.g., the error control circuit 180-*a* using the first code and the error control circuit 180-*b* using the second code) may be designed with the same Galois Field primitive polynomial.

The Galois Field primitive polynomial may further define α values. For example, the a values may be members of the Galois Field. A valid BCH codeword, expressed as a polynomial, has 2T consecutive roots of α, where T indicates the quantity of errors that the BCH code can correct. For the first code and second code to share parity (e.g., support decoding the same codeword with the same parity bits), the 2T consecutive roots of a for the first code are included within the 2T consecutive roots of a for the second code. As such, the first code may be designed independent of the second code, but the second code may be designed according to the design of the first code. Additionally, both decoders may be designed to identify the total size of a codeword to support error control operations for the codeword. In some examples, the memory system 110, the memory device 130, or both may use a set feature command to indicate the total size of the codeword.

As an example, the memory system 110 may implement BCH codewords to support error control operations. The memory device 130 may implement a first BCH decoder as the error control circuit 180-*a* to support detection and correction of a relatively small quantity of errors (e.g., 2 or 3 errors) using a relatively small amount of decoding logic, such as one or more closed-form equations. Additionally, the memory system 110 may implement a second BCH decoder as the error control circuit 180-*b* to support detection and correction of a relatively large quantity of errors (e.g., 80 errors) using a relatively large amount of decoding logic, such as a complex algorithmic decoder. If the first BCH decoder and the second BCH decoder are configured with a first BCH code and a second BCH code that share parity, as described herein, the memory device 130 may correct up to the relatively small quantity of errors (e.g., 2 or 3 errors) in an internal read operation without the memory device 130 storing any additional parity bits (e.g., beyond the bits stored to support correcting the relatively large quantity of errors at the second BCH decoder of the memory system controller 115).

A BCH code may correct up to a threshold quantity of errors, T. The error control circuit 180-*a* may use a first BCH code that can correct $T_1$ errors (e.g., $T_1=3$) and the error control circuit 180-*b* may use a second BCH code that can correct $T_2$ errors (e.g., $T_2=80$). As described herein, a valid BCH codeword, expressed as a polynomial, has 2T consecutive roots of α, where α is defined by the Galois Field. For example, a valid BCH codeword for the first BCH code may have the factors (e.g., roots) given by Expression 1.

$$(x-\alpha^1)(x-\alpha^2)\ldots(x-\alpha^{2T_1}) \qquad (1)$$

However, the powers of a may start at any value, such that the factors may span any 2T consecutive roots of $\alpha$. If the second BCH code uses the same Galois Field as the first BCH code, a valid BCH codeword for the second BCH code may also be valid for the first BCH code if the valid BCH codeword shares the same factors (e.g., roots) as the valid BCH codeword for the first BCH code. For example, a BCH codeword may be valid for both the first BCH code and the second BCH code if the BCH codeword has the factors given by Expression 2, which includes the factors given by Expression 1 if $T_2 > T_1$.

$$(x-\alpha^1)(x-\alpha^2)\ldots(x-\alpha^{2T_2}) \qquad (2)$$

Specifically, if the factors of a valid "small" codeword (e.g., a codeword valid for the first BCH code) are included in the factors of a valid "large" codeword (e.g., a codeword valid for the second BCH code), the "large" codeword supports decoding by both the first BCH code and the second BCH code.

Accordingly, for write operations, the memory system 110 may receive data to write to a memory device 130 and may use a generator polynomial to generate a codeword (e.g., a BCH codeword) using the data. For example, the generator polynomial may generate parity bits to store in addition to the data at the memory device 130. The data and parity bits may form a codeword that is valid for both the error control circuit 180-a (e.g., using the first BCH code) and the error control circuit 180-b (e.g., using the second BCH code).

To perform an internal read operation, the memory device 130 may retrieve the BCH codeword from the memory die 160, and the error control circuit 180-a may decode the BCH codeword using the first BCH code. The decoding logic at the error control circuit 180-a may correct up to T1 errors according to the design of the decoding logic using the codeword. The decoding process at the error control circuit 180-a may be independent of the error control circuit 180-b and the second BCH code. To perform a host read operation, the memory system 110 may retrieve the same BCH codeword from the memory die 160, and the error control circuit 180-b may decode the codeword using the second BCH code. The error control circuit 180-b may correct up to T2 errors according to the design of the decoding logic for the error control circuit 180-b using the codeword.

The system 100 may include any quantity of non-transitory computer readable media that support error correction for internal read operations. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

Although the features of the disclosure are described herein with reference to NAND memory devices 130, the features of the disclosure may be implemented with other memory devices 130 or memory systems 110. For example, one or more features of the disclosure described herein may be implemented in non-volatile memory or other memory devices 130, such as DRAM, FeRAM, a chalcogenide-based memory, or other types of memory technology.

Figure 2:
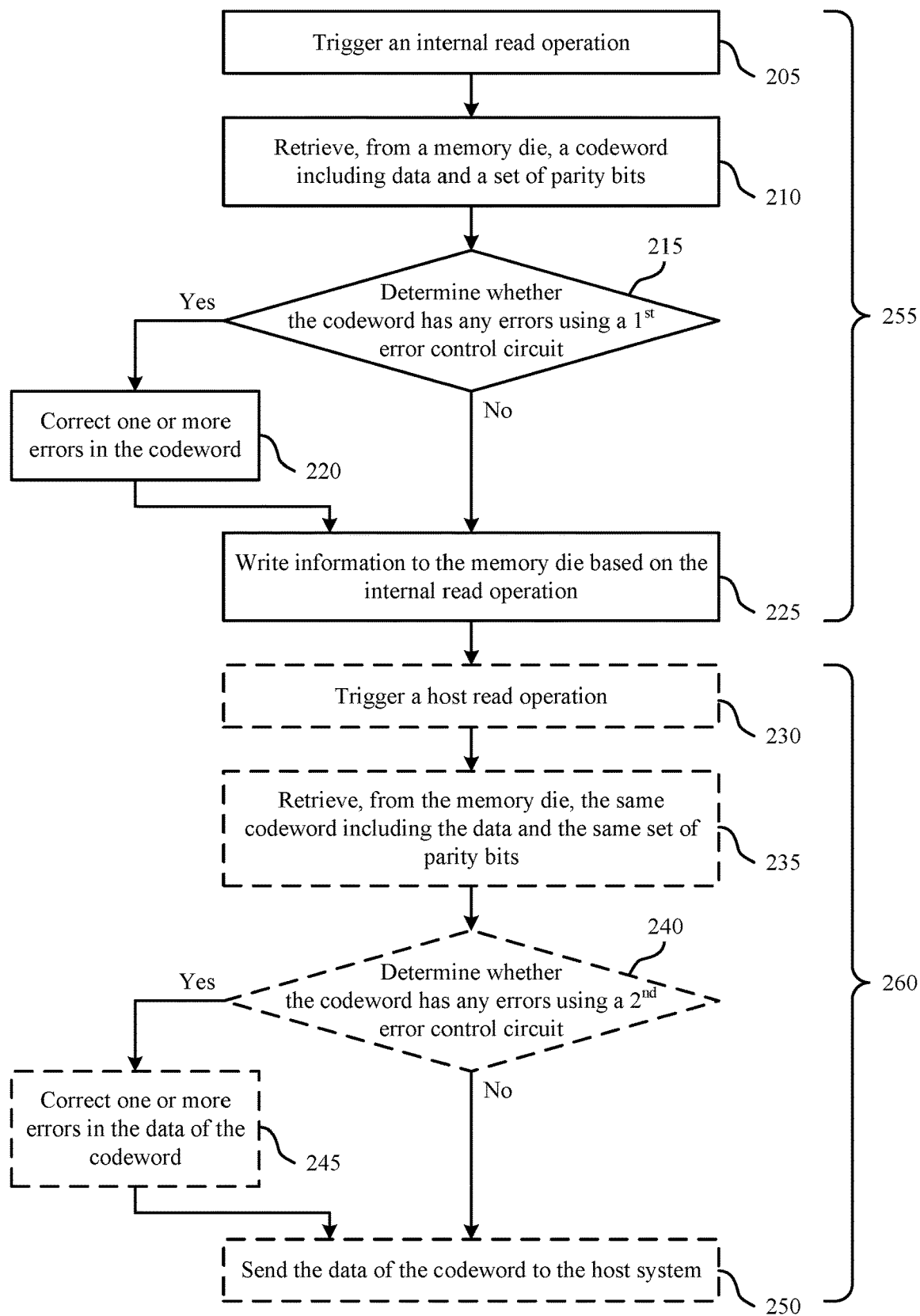
FIG. 2 illustrates an example of a process flow that supports error correction for internal read operations in accordance with examples as disclosed herein.

FIG. 2 illustrates an example of a process flow 200 that supports error correction for internal read operations in accordance with examples as disclosed herein. The process flow 200 may be performed by a memory device, a memory system, or both as described with reference to FIG. 1. For example, a first set of processes 255 may be performed internal to a memory device, while a second set of processes 260 may be performed by a memory system using a memory system controller. Alternative examples of the following may be implemented, where some processes are performed in a different order than described or are not performed at all. In some cases, processes may include additional features not mentioned below, or further processes may be added.

At 205, an internal read operation is triggered. The internal read operation may be a portion of a copyback operation, a garbage collection operation, a write operation of a multiple-level memory cell, an iterative write operation, or some combination thereof. A memory device may perform the internal read operation as a "pre-read" to read data written to a memory die prior to writing information (e.g., new data, data previously stored at the memory die) back to the memory die.

At 210, a codeword is retrieved from the memory die. The memory device may retrieve, from the memory die, the codeword including data and a set of parity bits. For example, the memory die may store, in a first portion of the memory die, a set of data bits corresponding to the data (e.g., host data) and may store, in a second portion of the memory die, a set of parity bits generated in response to the set of data bits. The set of data bits and the set of parity bits may form a codeword that is configured for use by both a first error control operation at a first error control circuit and a second error control operation at a second error control circuit, as described with reference to FIG. 1. The codeword may be an example of a BCH codeword, a Reed-Solomon codeword, or another codeword that supports error correction for both an internal read operation and a host read operation.

At 215, an error control operation is performed by an error control circuit. For example, a decoder on the memory die (e.g., a NAND die) may decode the retrieved codeword. The decoding logic of the decoder may support detection of a first quantity of errors. The first quantity of errors may be relatively small (e.g., below a threshold value, such as 4) to support low-complexity decoding. Because the decoder is on the memory die, reducing the decoding complexity may correspond to significant resource and performance savings at the memory die. The decoder (e.g., a first error control circuit) may determine whether the codeword has any errors using the decoding logic, for example, corresponding to a first BCH code.

If the codeword includes a quantity of errors correctable by the decoder on the memory die, at 220, the errors are corrected. For example, if the first error control circuit detects up to the first quantity of errors, the first error control circuit may fix the errors (e.g., switch the bit values) to determine a valid codeword. In some cases, the first error control circuit may correct errors in the data bits, parity bits, or both. For example, because the internal read operation may be performed in order to write information back to the memory die, correcting parity bits may add value by improving the likelihood of successful decoding for subsequent read operations.

If the codeword does not include a quantity of errors correctable by the decoder on the memory die, no errors are corrected. In some examples, the codeword may have zero errors. In some other examples, the codeword may have a quantity of errors exceeding the first quantity of errors correctable by the decoder. In such examples, the memory device may refrain from modifying the codeword and may generate an indication that the codeword has an error that is uncorrectable by the decoder (e.g., the first error control circuit). The memory device may store the indication of an uncorrectable error in a log with an indication of the corresponding data, may surface the indication of the uncorrectable error to the memory system controller, or both. In some examples, the uncorrectable error may trigger the memory device to send the codeword to the memory system controller for error correction using the second error control circuit that supports correcting a second quantity of errors greater than the first quantity of errors. For example, an error that is uncorrectable by the decoder on the memory die in some cases may be correctable by a decoder at the memory system controller.

At 225, information is written back to the memory die. For example, the memory device may determine the bits to write to the memory die according to the results of the internal read operation. If performing a copyback operation, the memory device may write the codeword read during the internal read operation (e.g., a corrected codeword) back to the memory device in an updated location. If performing a write operation (e.g., a write operation for a multiple-level memory cell or an iterative write operation), the memory device may determine the bits to write using the codeword read during the internal read operation (e.g., a corrected codeword) and the input data to write to the memory die.

In some examples, at 230, a host read operation is triggered. For example, the memory system may receive, from a host system, a command to read data from the memory die.

At 235, a codeword is retrieved from the memory die. For example, a memory system controller of the memory system may retrieve the codeword including the data requested in the read command. The memory system controller may retrieve the data from the memory device, such that the data may be decoded external to the memory device. The codeword may be the same codeword retrieved at 210. That is, the same codeword, including the same data bits and the same parity bits, may be retrieved and decoded for internal read operations and host read operations. In some examples, the codeword retrieved for the host read operation may include fewer errors due to the error correction used for the internal read operations (e.g., as compared to a system that does not implement error correction for internal reads).

At 240, an error control operation is performed by an error control circuit. For example, a decoder at the memory system controller may decode the retrieved codeword. The decoding logic of the decoder may support detection of a second quantity of errors. The second quantity of errors may be relatively large (e.g., greater than a threshold value, such as 50) to support reliable decoding and mitigation of data corruption. The decoder (e.g., a second error control circuit) may determine whether the codeword has any errors using the decoding logic, for example, corresponding to a second BCH code.

If the codeword includes a quantity of errors correctable by the decoder at the memory system controller, at 245, the errors are corrected. For example, if the second error control circuit detects up to the second quantity of errors, the second error control circuit may fix the errors (e.g., switch the bit values) to determine a valid codeword. In some cases, the second error control circuit may correct errors in the data bits but may refrain from correcting errors in the parity bits, because the data (and not the parity bits) is sent to the host system in response to the host read command. If the codeword does not include a quantity of errors correctable by the decoder on the memory die, no errors are corrected.

At 250, the decoded data is sent to the host system. For example, the memory system may send the requested data, corrected using the second error control circuit, to the host system in response to the command to read data from the memory die.

Aspects of the process flow 200 may be implemented by a controller (e.g. a local controller of a memory device, a memory system controller, or both), among other components. Additionally or alternatively, aspects of the process flow 200 may be implemented as instructions stored in memory (e.g., firmware stored in a memory coupled with a memory device or memory system). For example, the instructions, if executed by a controller (e.g., the local controller of the memory device, the memory system controller, or both), may cause the controller to perform the operations of the process flow 200.

Figure 3A:
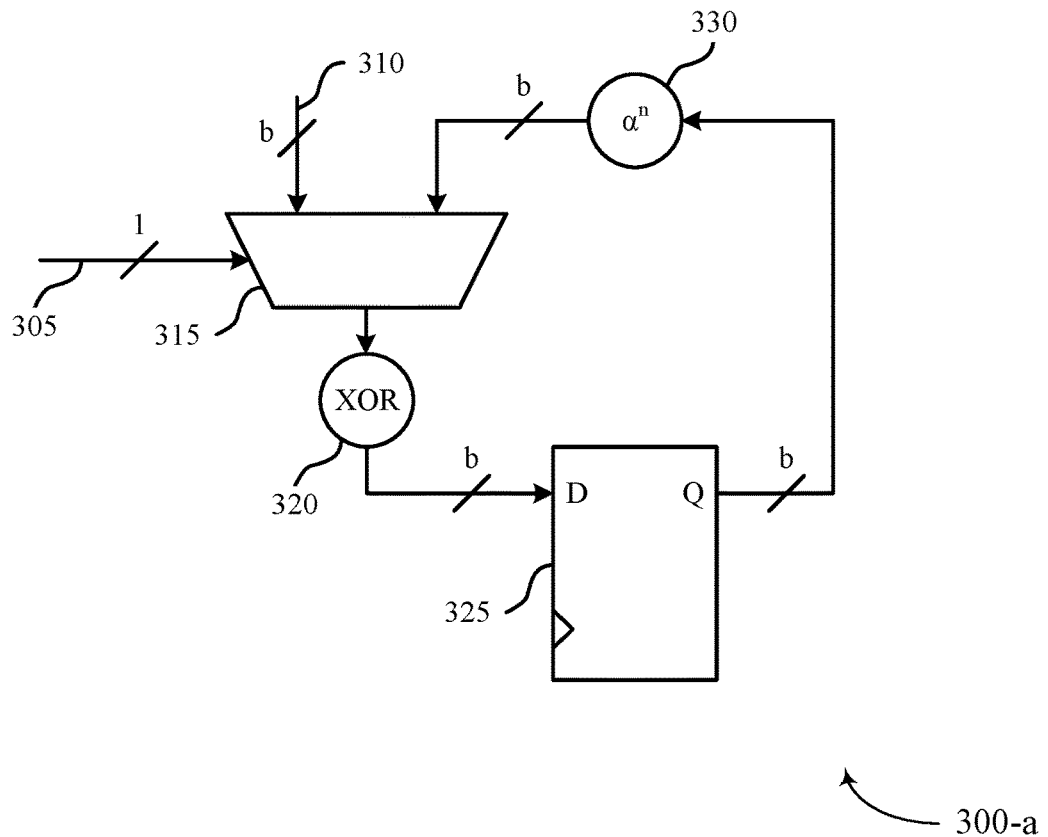
FIGS. 3A and 3B illustrate examples of circuits for generating syndromes that support error correction for internal read operations in accordance with examples as disclosed herein.
Figure 3B:
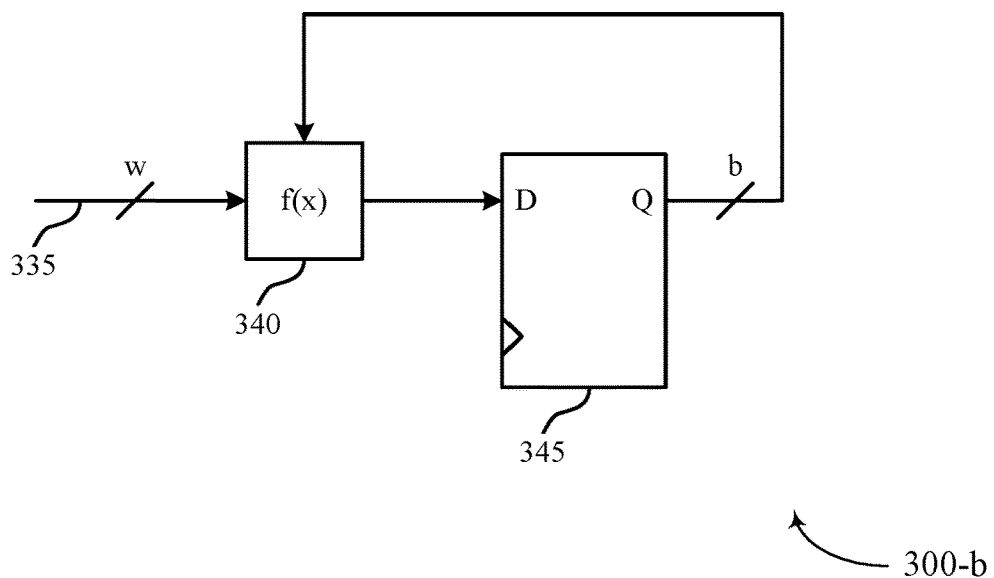

FIGS. 3A and 3B illustrate examples of circuits 300 for generating syndromes that support error correction for internal read operations in accordance with examples as disclosed herein. The circuits 300 may be examples of syndrome generators. A circuit 300 may be a component or example of an error control circuit, decoder, or both. For example, the circuit 300 may be an example of a first error control circuit on a memory die, as described with reference to FIGS. 1 and 2. The circuit 300 may calculate syndromes as part of an error control operation to identify and correct one or more errors in a codeword.

An error control circuit with a relatively low complexity that supports detection of a relatively small quantity of errors (e.g., below a threshold quantity of errors, such as 4) may be susceptible to mis-correction. For example, such an error control circuit may use a code (e.g., a BCH code) with a relatively small distance between valid codewords (e.g., a relatively small minimum distance). That is, a first valid codeword may be changed into a second valid codeword with a small quantity of bit flips. Mis-correction may occur if the error control circuit receives a codeword with more errors than it can correct, which may cause the error control circuit to mis-identify at least some of the errors. The error control circuit may then modify the codeword into a different codeword using the mis-identified errors.

To perform error correction, the error control circuit may use a set of syndromes. For example, the error control circuit may generate syndromes by inputting the codeword into a syndrome generator. If the generated syndromes have values of zero, the codeword is a valid codeword. If not, the error control circuit may modify one or more bits (e.g., up to the quantity of bits supported for detection and correction) to determine a codeword that results in generated syndromes with zero values. In some examples, the error control circuit may flip one or more bits and re-generate the syndromes (e.g., using the same syndrome generator) to check if the corrections result in a valid codeword (e.g., each generated syndrome has a zero value). In some other examples, the error control circuit may modify the syndromes using the correction information and according to changes in one or more specific bits. A correctable error may be identified if the error control circuit determines a valid codeword by modifying a quantity of bits equal to or less than the quantity of errors detectable by the error control circuit. An uncorrectable error may be identified if the error control circuit cannot determine a valid codeword by modifying a quantity of bits equal to or less than the quantity of errors detectable by the error control circuit.

An error control circuit may use two syndromes for each error the error control circuit can correct. For example, to support correcting T errors, the error control circuit may generate 2T syndromes. However, for error control circuits that support correcting a relatively small quantity of errors (e.g., T=3), using a similarly small quantity of syndromes (e.g., 6 syndromes) may result in a relatively small minimum distance for the code and, correspondingly, a significant likelihood of mis-correction.

To protect against mis-correction, an error control circuit may calculate a set of syndromes having a total quantity that is greater than two times the quantity of errors for which detection is supported by the error control operation. That is, the error control circuit may generate extra syndromes (e.g., more than 2T syndromes) to increase the minimum distance of the decoder and decrease the probability of mis-correction. In some examples, the error control circuit may generate extra odd-numbered syndromes and may refrain from generating extra even-numbered syndromes, because even-numbered syndromes may not be independent. For example, each even-numbered syndrome may be generated by squaring a lower-numbered syndrome (e.g., $S_{2n}=S_n^2$). The first error control circuit, as described herein, may support generating extra syndromes because of the quantity of parity bits associated with the codeword. The quantity of parity bits may be based on the error control operation performed by the second error control circuit, which may be operable to correct more errors than the error control operation performed by the first error control circuit. That is, because a valid codeword used for the first error control circuit for detecting up to $T_1$ errors is also a valid codeword used for the second error control circuit for detecting up to $T_2$ errors, where $T_2 > T_1$, the first error control circuit may generate up to $2T_2$ syndromes (e.g., because the second error control circuit supports this quantity of syndromes). Accordingly, to reduce the likelihood of mis-correction at the decoder on the memory die, the decoder may generate a quantity of syndromes, N (including k extra syndromes) given by Equation 3.

$$N=2T_1+k, \text{ where } N \leq 2T_2 \quad (3)$$

Additionally or alternatively, to protect against mis-correction, a memory system may implement cyclic redundancy check (CRC) bits with a codeword. However, to support CRC operations, the first error control circuit on a memory die may coordinate with the second error control circuit at a memory system controller to support a common CRC for different codes (e.g., a first BCH code and a second BCH code).

FIG. 3A illustrates an example of a circuit 300-a configured to generate a quantity (n) of syndromes for a codeword one bit at a time. The circuit 300-a may support a syndrome generation process using extra syndromes (e.g., k extra syndromes). Bits of a codeword may be input into a syndrome generator (e.g., one bit at a time) at 305 to generate each syndrome, n, of the set of N syndromes. The syndrome generator design may depend on the Galois Field for the decoder. For example, the circuit 300-a may operate according to a Galois Field width, b. At 310, a set of bits of the field width, b, with zero bit values is sent to the syndrome generator. The set of zero-bits may pass through a multiplexer 315 with the data input (e.g., the bits of the codeword) and a set of bits fed back from the syndrome generator, and the resulting bits may pass through an XOR gate 320. The circuit 300-a may further include a latch 325 (e.g., a d-latch) and a multiplier 330 (e.g., a Galois Field multiplier) determined according to the Galois Field for the decoder. The multiplier 330 may include an AND gate, an OR gate, or both. The circuit 300-a may generate the set of syndromes (e.g., a set of N syndromes greater than $2T_1$ as described herein) in response to the input codeword to support error correction.

FIG. 3B illustrates an example of a circuit 300-b configured to generate a quantity (n) of syndromes for a codeword w bits at a time. The circuit 300-b may be an example of a parallelized syndrome generator. The data path width, w, of the circuit 300-b may depend on a memory chip implementation. The function $f(x)$ 340 may include one or more AND gates, OR gates, or both. Bits of a codeword may be input into the syndrome generator (e.g., w bit at a time) at 335 to generate the syndromes. The w input bits may be processed by the function $f(x)$ 340 to generate a result as if the w bits were shifted into the syndrome generator one at a time. The circuit 300-b may further include a latch 345 (e.g., a d-latch). The circuit 300-b may generate the set of syndromes (e.g., a set of N syndromes greater than $2T_1$ as described herein) in response to the input codeword to support error correction. The feedback of the circuit 300-b may have a width, b, which may also be the width of the syndrome and the Galois field.

Figure 4:
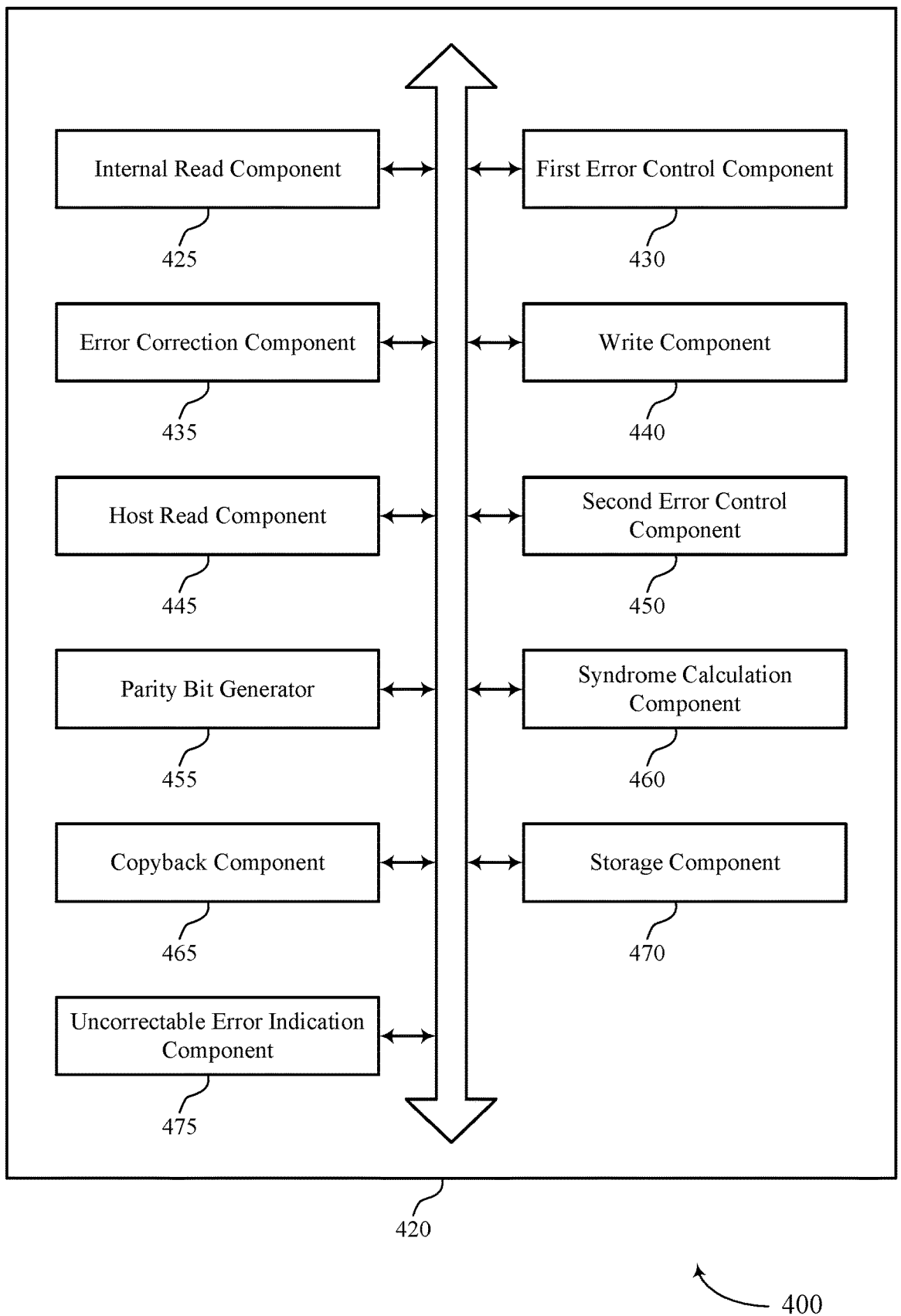
FIG. 4 shows a block diagram of a memory device or memory system that supports error correction for internal read operations in accordance with examples as disclosed herein.

FIG. 4 shows a block diagram 400 of a memory device or memory system 420 that supports error correction for internal read operations in accordance with examples as disclosed herein. The memory device or memory system 420 may be an example of aspects of a memory device 130 or a memory system 110 as described with reference to FIGS. 1 through 3. The memory device or memory system 420, or various components thereof, may be an example of means for performing various aspects of error correction for internal read operations as described herein. For example, the memory device or memory system 420 may include an internal read component 425, a first error control component 430, an error correction component 435, a write component 440, a host read component 445, a second error control component 450, a parity bit generator 455, a syndrome calculation component 460, a copyback component 465, a storage component 470, an uncorrectable error indication component 475, or any combination thereof. Each of these components may communicate, directly or indirectly, with one another (e.g., via one or more buses).

The memory device or memory system 420 may include or be an example of an apparatus including a memory die and a control circuit coupled with the memory die. The control circuit may be configured to cause the apparatus to perform one or more operations described herein. For example, a memory device, such as a memory device 130 described with reference to FIG. 1, may include a memory die, such as a memory die 160. The memory device may perform internal read operations without moving data to a memory system controller, such as a memory system controller 115. Accordingly, an internal read operation may correspond to a read operation performed internal to a memory device. A memory system, such as a memory system 110 described with reference to FIG. 1, may include one or more memory devices, each including a memory die. As such, the memory system 110 may support internal read operations—performed internally at one or more memory devices—as well as host read operations involving a memory system controller.

The internal read component 425 may be configured as or otherwise support a means for retrieving, from the memory die, a codeword as part of an internal read operation that is initiated independent of a read command received from a host system, the codeword including data and a set of parity bits. The first error control component 430 may be configured as or otherwise support a means for identifying, by a first error control operation supporting detection of a first quantity of errors and implemented by a first error control circuit on the memory die, one or more errors in the data of the codeword using the set of parity bits, where the codeword is also configured for use by a second error control operation that supports detection of a second quantity of errors greater than the first quantity of errors using the set of parity bits (i.e., the same set of parity bits). The error correction component 435 may be configured as or otherwise support a means for correcting the one or more errors in the data of the codeword based at least in part on identifying the one or more errors. The write component 440 may be configured as or otherwise support a means for writing, to the memory die, information based at least in part on correcting the one or more errors in the data of the codeword.

In some examples, the host read component 445 may be configured as or otherwise support a means for receiving, from the host system, a first command to read the data of the codeword from the memory die. In some examples, the host read component 445 may be configured as or otherwise support a means for retrieving, from the memory die, the codeword as part of a read operation in response to receiving the first command to read the data. In some examples, the second error control component 450 may be configured as or otherwise support a means for identifying, by the second error control operation implemented by a second error control circuit, one or more second errors in the data of the codeword using the set of parity bits. In some examples, the host read component 445 may be configured as or otherwise support a means for transmitting the data of the codeword to the host system based at least in part on identifying the one or more second errors.

In some examples, the first error control component 430 may be configured as or otherwise support a means for refraining from performing the first error control operation on the codeword using the first error control circuit in response to receiving the first command to read the data.

In some examples, the error correction component 435 may be configured as or otherwise support a means for refraining from correcting errors in the data of the codeword using the first error control circuit in response to the first command to read the data. In some examples, the error correction component 435 may be configured as or otherwise support a means for correcting the one or more second errors in the data of the codeword based at least in part on identifying the one or more second errors using the second error control circuit, where transmitting the data of the codeword is based at least in part on correcting the one or more second errors.

In some examples, the write component 440 may be configured as or otherwise support a means for receiving a second command to write the data to the memory die. In some examples, the parity bit generator 455 may be configured as or otherwise support a means for identifying the set of parity bits associated with the data using a generator polynomial. In some examples, the write component 440 may be configured as or otherwise support a means for writing the codeword to the memory die based at least in part on identifying the set of parity bits.

In some examples, to support correcting the one or more errors in the data of the codeword, the error correction component 435 may be configured as or otherwise support a means for modifying one or more data bits of the data of the codeword, one or more parity bits of the set of parity bits of the codeword, or a combination thereof, where the one or more data bits, the one or more parity bits, or the combination thereof has a total quantity of bits less than or equal to the first quantity of errors for which detection is supported by the first error control operation.

In some examples, to support identifying the one or more errors, the syndrome calculation component 460 may be configured as or otherwise support a means for calculating a set of syndromes for the codeword, the set of syndromes having a total quantity of syndromes that is greater than two times the first quantity of errors for which detection is supported by the first error control operation. In some examples, to support identifying the one or more errors, the syndrome calculation component 460 may be configured as or otherwise support a means for determining that at least one syndrome of the set of syndromes includes a non-zero value, the non-zero value indicating an error in the codeword. In some examples, to support identifying the one or more errors, the syndrome calculation component 460 may be configured as or otherwise support a means for modifying at least one bit of the codeword to correct the one or more errors in the data of the codeword, the modifying the at least one bit of the codeword causing each syndrome of the set of syndromes to include a zero value.

In some examples, the internal read component 425 may be configured as or otherwise support a means for retrieving, from the memory die, a second codeword as part of a second internal read operation. In some examples, the syndrome calculation component 460 may be configured as or otherwise support a means for calculating, by the first error control operation implemented by the first error control circuit on the memory die, a second set of syndromes for the second codeword, the second set of syndromes having the total quantity of syndromes that is greater than two times the first quantity of errors for which detection is supported by the first error control operation. In some examples, the syndrome calculation component 460 may be configured as or otherwise support a means for failing to determine a set of bits of the second codeword to modify that is less than or equal to the first quantity of errors for which detection is supported by the first error control operation and that causes each syndrome of the second set of syndromes to include the zero value. In some examples, the uncorrectable error indication component 475 may be configured as or otherwise support a means for generating an indication that the second codeword has a second error that is uncorrectable by the first error control circuit based at least in part on failing to determine the set of bits of the second codeword to modify.

In some examples, the write component 440 may be configured as or otherwise support a means for receiving a third command to write a first set of data to a multiple-level memory cell of the memory die, where the internal read operation is performed to determine the data of the codeword written to a first page of the multiple-level memory cell. In some examples, the write component 440 may be configured as or otherwise support a means for determining a second set of data to write to the multiple-level memory cell based at least in part on the first set of data and the data of the codeword, where writing the information to the memory die includes writing the second set of data to a second page of the multiple-level memory cell.

In some examples, the write component 440 may be configured as or otherwise support a means for receiving a fourth command to write a first set of data to a partition of the memory die, where the internal read operation is performed to determine the data of the codeword written to the partition of the memory die. In some examples, the write component 440 may be configured as or otherwise support a means for determining a subset of bits that is different between the first set of data and the data of the codeword, where writing the information to the memory die includes overwriting the subset of bits at the partition of the memory die.

In some examples, the copyback component 465 may be configured as or otherwise support a means for performing a copyback operation on the data of the codeword, where the internal read operation is performed to determine the data of the codeword written to a first partition of the memory die and writing the information to the memory die includes writing the data of the codeword to a second partition of the memory die.

In some examples, the internal read operation includes at least a portion of a copyback operation, a garbage collection operation, a write operation of a multiple-level memory cell, an iterative write operation, or a combination thereof.

In some examples, the storage component 470 may be configured as or otherwise support a means for storing, in a first portion of the memory die, a set of data bits corresponding to the data of the codeword. In some examples, the storage component 470 may be configured as or otherwise support a means for storing, in a second portion of the memory die, the set of parity bits of the codeword, where the set of parity bits is based at least in part on the set of data bits.

In some examples, the internal read component 425 may be configured as or otherwise support a means for refraining from sending the codeword to a controller of a memory system including the memory die as part of the internal read operation.

In some examples, the first error control operation and the second error control operation use a same Galois Field primitive polynomial and operate on a same codeword size. In some examples, the codeword includes a BCH codeword or a Reed-Solomon codeword.

Figure 5:
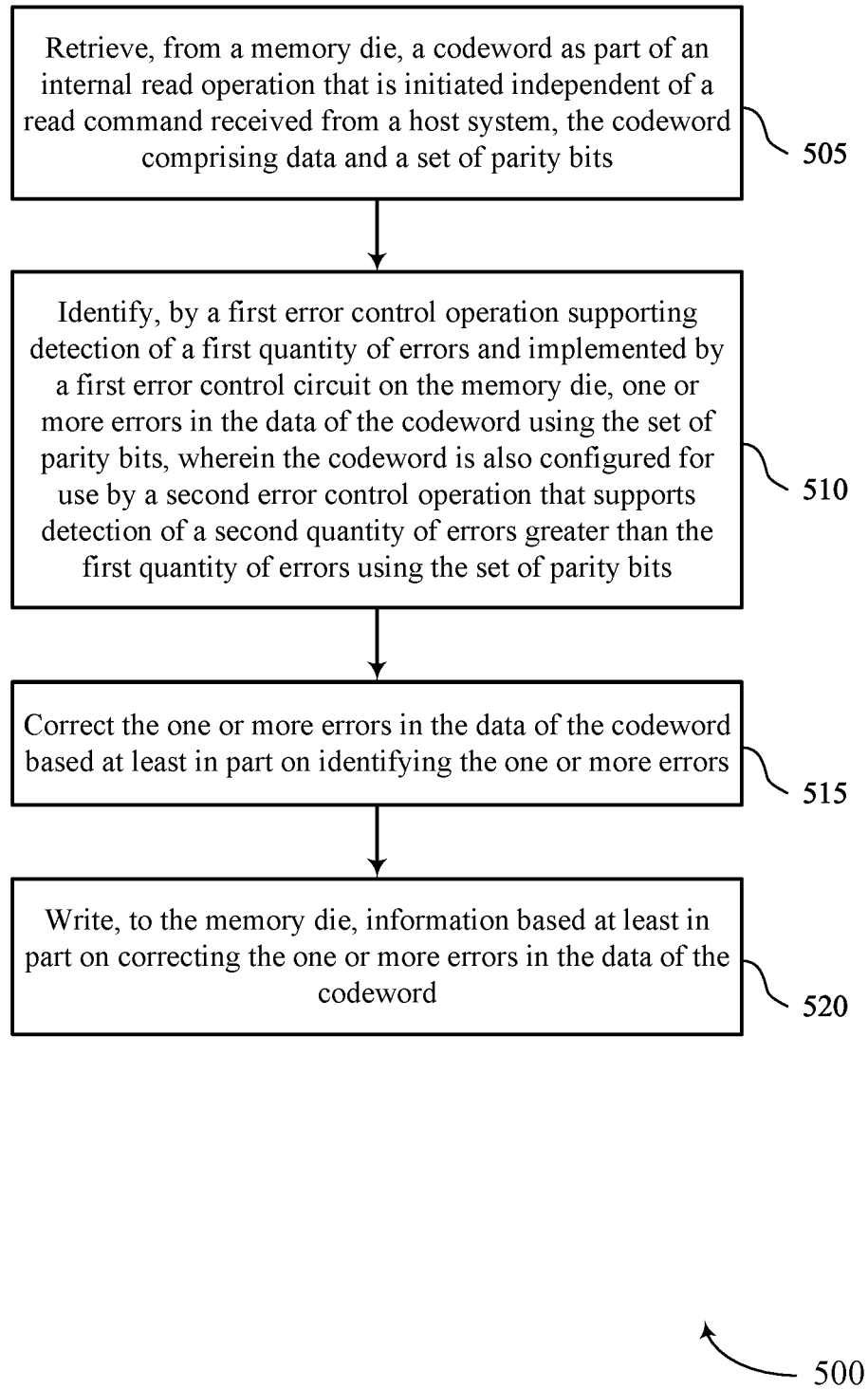
FIG. 5 shows a flowchart illustrating a method or methods that support error correction for internal read operations in accordance with examples as disclosed herein.

FIG. 5 shows a flowchart illustrating a method 500 that supports error correction for internal read operations in accordance with examples as disclosed herein. The operations of method 500 may be implemented by a memory device, a memory system, or components of a memory device or memory system as described herein. For example, the operations of method 500 may be performed by a memory device or memory system as described with reference to FIGS. 1 through 4. In some examples, a memory device or memory system may execute a set of instructions to control the functional elements of the device to perform the described functions. Additionally or alternatively, the memory device or memory system may perform aspects of the described functions using special-purpose hardware.

At 505, the method may include retrieving, from a memory die, a codeword as part of an internal read operation that is initiated independent of a read command received from a host system, the codeword including data and a set of parity bits. The operations of 505 may be performed in accordance with examples as disclosed herein. In some examples, aspects of the operations of 505 may be performed by an internal read component 425 as described with reference to FIG. 4.

At 510, the method may include identifying, by a first error control operation supporting detection of a first quantity of errors and implemented by a first error control circuit on the memory die, one or more errors in the data of the codeword using the set of parity bits, where the codeword is also configured for use by a second error control operation that supports detection of a second quantity of errors greater than the first quantity of errors using the set of parity bits. The operations of 510 may be performed in accordance with examples as disclosed herein. In some examples, aspects of the operations of 510 may be performed by a first error control component 430 as described with reference to FIG. 4.

At 515, the method may include correcting the one or more errors in the data of the codeword based at least in part on identifying the one or more errors. The operations of 515 may be performed in accordance with examples as disclosed herein. In some examples, aspects of the operations of 515 may be performed by an error correction component 435 as described with reference to FIG. 4.

At 520, the method may include writing, to the memory die, information based at least in part on correcting the one or more errors in the data of the codeword. The operations of 520 may be performed in accordance with examples as disclosed herein. In some examples, aspects of the operations of 520 may be performed by a write component 440 as described with reference to FIG. 4.

In some examples, an apparatus as described herein may perform a method or methods, such as the method 500. The apparatus may include features, circuitry, logic, means, or instructions (e.g., a non-transitory computer-readable medium storing code including instructions executable by a processor of an electronic device) for retrieving, from the memory die, a codeword as part of an internal read operation that is initiated independent of a read command received from a host system, the codeword including data and a set of parity bits, identifying, by a first error control operation supporting detection of a first quantity of errors and implemented by a first error control circuit on the memory die, one or more errors in the data of the codeword using the set of parity bits, where the codeword is also configured for use by a second error control operation that supports detection of a second quantity of errors greater than the first quantity of errors using the set of parity bits, correcting the one or more errors in the data of the codeword based at least in part on identifying the one or more errors, and writing, to the memory die, information based at least in part on correcting the one or more errors in the data of the codeword.

Some examples of the method 500 and the apparatus described herein may further include operations, features, circuitry, logic, means, or instructions for receiving, from the host system, a first command to read the data of the codeword from the memory die, retrieving, from the memory die, the codeword as part of a read operation in response to receiving the first command to read the data, identifying, by the second error control operation implemented by a second error control circuit, one or more second errors in the data of the codeword using the set of parity bits, and transmitting the data of the codeword to the host system based at least in part on identifying the one or more second errors.

Some examples of the method 500 and the apparatus described herein may further include operations, features, circuitry, logic, means, or instructions for refraining from performing the first error control operation on the codeword using the first error control circuit in response to receiving the first command to read the data.

Some examples of the method 500 and the apparatus described herein may further include operations, features, circuitry, logic, means, or instructions for refraining from correcting errors in the data of the codeword using the first error control circuit in response to the first command to read the data and correcting the one or more second errors in the data of the codeword based at least in part on identifying the one or more second errors using the second error control circuit, where transmitting the data of the codeword may be based at least in part on correcting the one or more second errors.

Some examples of the method 500 and the apparatus described herein may further include operations, features, circuitry, logic, means, or instructions for receiving a second command to write the data to the memory die, identifying the set of parity bits associated with the data using a generator polynomial, and writing the codeword to the memory die based at least in part on identifying the set of parity bits.

In some examples of the method 500 and the apparatus described herein, correcting the one or more errors in the data of the codeword may include operations, features, circuitry, logic, means, or instructions for modifying one or more data bits of the data of the codeword, one or more parity bits of the set of parity bits of the codeword, or a combination thereof, where the one or more data bits, the one or more parity bits, or the combination thereof may have a total quantity of bits less than or equal to the first quantity of errors for which detection may be supported by the first error control operation.

In some examples of the method 500 and the apparatus described herein, identifying the one or more errors may include operations, features, circuitry, logic, means, or instructions for calculating a set of syndromes for the codeword, the set of syndromes having a total quantity of syndromes that may be greater than two times the first quantity of errors for which detection may be supported by the first error control operation, determining that at least one syndrome of the set of syndromes includes a non-zero value, the non-zero value indicating an error in the codeword, and modifying at least one bit of the codeword to correct the one or more errors in the data of the codeword, the modifying the at least one bit of the codeword causing each syndrome of the set of syndromes to include a zero value.

Some examples of the method 500 and the apparatus described herein may further include operations, features, circuitry, logic, means, or instructions for retrieving, from the memory die, a second codeword as part of a second internal read operation, calculating, by the first error control operation implemented by the first error control circuit on the memory die, a second set of syndromes for the second codeword, the second set of syndromes having the total quantity of syndromes that may be greater than two times the first quantity of errors for which detection may be supported by the first error control operation, failing to determine a set of bits of the second codeword to modify that may be less than or equal to the first quantity of errors for which detection may be supported by the first error control operation and that causes each syndrome of the second set of syndromes to include the zero value, and generating an indication that the second codeword may have a second error that may be uncorrectable by the first error control circuit based at least in part on failing to determine the set of bits of the second codeword to modify.

Some examples of the method 500 and the apparatus described herein may further include operations, features, circuitry, logic, means, or instructions for receiving a third command to write a first set of data to a multiple-level memory cell of the memory die, where the internal read operation may be performed to determine the data of the codeword written to a first page of the multiple-level memory cell and determining a second set of data to write to the multiple-level memory cell based at least in part on the first set of data and the data of the codeword, where writing the information to the memory die includes writing the second set of data to a second page of the multiple-level memory cell.

Some examples of the method 500 and the apparatus described herein may further include operations, features, circuitry, logic, means, or instructions for receiving a fourth command to write a first set of data to a partition of the memory die, where the internal read operation may be performed to determine the data of the codeword written to the partition of the memory die and determining a subset of bits that may be different between the first set of data and the data of the codeword, where writing the information to the memory die includes overwriting the subset of bits at the partition of the memory die.

Some examples of the method 500 and the apparatus described herein may further include operations, features, circuitry, logic, means, or instructions for performing a copyback operation on the data of the codeword, where the internal read operation may be performed to determine the data of the codeword written to a first partition of the memory die and writing the information to the memory die includes writing the data of the codeword to a second partition of the memory die.

In some examples of the method 500 and the apparatus described herein, the internal read operation includes at least a portion of a copyback operation, a garbage collection operation, a write operation of a multiple-level memory cell, an iterative write operation, or a combination thereof.

Some examples of the method 500 and the apparatus described herein may further include operations, features, circuitry, logic, means, or instructions for storing, in a first portion of the memory die, a set of data bits corresponding to the data of the codeword and storing, in a second portion of the memory die, the set of parity bits of the codeword, where the set of parity bits may be based at least in part on the set of data bits.

Some examples of the method 500 and the apparatus described herein may further include operations, features, circuitry, logic, means, or instructions for refraining from sending the codeword to a controller of a memory system including the memory die as part of the internal read operation.

In some examples of the method 500 and the apparatus described herein, the first error control operation and the second error control operation use a same Galois Field primitive polynomial and operate on a same codeword size.

In some examples of the method 500 and the apparatus described herein, the codeword includes a BCH codeword or a Reed-Solomon codeword.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if" "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action.

In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope as disclosed herein. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, DSL, or technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory die; and
   a control circuit coupled with the memory die and configured to cause the apparatus to:
   retrieve, from the memory die, a codeword as part of an internal read operation that is initiated independent of a read command received from a host system, the codeword comprising data and a set of parity bits;
   identify, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits, the second error control operation implemented by a second error control circuit;
   correct the one or more errors in the data of the codeword based at least in part on identifying the one or more errors; and
   write, to the memory die, information based at least in part on correcting the one or more errors in the data of the codeword.

2. The apparatus of claim 1, wherein the control circuit is further configured to cause the apparatus to:
   receive a second command to write the data to the memory die;
   identify the set of parity bits associated with the data using a generator polynomial; and
   write the codeword to the memory die based at least in part on identifying the set of parity bits.

3. The apparatus of claim 1, wherein the control circuit configured to cause the apparatus to correct the one or more errors in the data of the codeword is configured to cause the apparatus to:
   modify one or more data bits of the data of the codeword, one or more parity bits of the set of parity bits of the codeword, or a combination thereof, wherein the one or more data bits, the one or more parity bits, or the combination thereof has a total quantity of bits less than or equal to the first quantity of errors for which detection is supported by the first error control operation.

4. The apparatus of claim 1, wherein the control circuit configured to cause the apparatus to identify the one or more errors is configured to cause the apparatus to:
  calculate a set of syndromes for the codeword, the set of syndromes having a total quantity of syndromes that is greater than two times the first quantity of errors for which detection is supported by the first error control operation;
  determine that at least one syndrome of the set of syndromes comprises a non-zero value, the non-zero value indicating an error in the codeword; and
  modify at least one bit of the codeword to correct the one or more errors in the data of the codeword, the modifying the at least one bit of the codeword causing each syndrome of the set of syndromes to comprise a zero value.

5. The apparatus of claim 4, wherein the control circuit is further configured to cause the apparatus to:
  retrieve, from the memory die, a second codeword as part of a second internal read operation;
  calculate, by the first error control operation implemented by the first error control circuit on the memory die, a second set of syndromes for the second codeword, the second set of syndromes having the total quantity of syndromes that is greater than two times the first quantity of errors for which detection is supported by the first error control operation;
  fail to determine a set of bits of the second codeword to modify that is less than or equal to the first quantity of errors for which detection is supported by the first error control operation and that causes each syndrome of the second set of syndromes to comprise the zero value; and
  generate an indication that the second codeword has a second error that is uncorrectable by the first error control circuit based at least in part on failing to determine the set of bits of the second codeword to modify.

6. The apparatus of claim 1, wherein the control circuit is further configured to cause the apparatus to:
  receive a third command to write a first set of data to a multiple-level memory cell of the memory die, wherein the internal read operation is performed to determine the data of the codeword written to a first page of the multiple-level memory cell; and
  determine a second set of data to write to the multiple-level memory cell based at least in part on the first set of data and the data of the codeword, wherein writing the information to the memory die comprises writing the second set of data to a second page of the multiple-level memory cell.

7. The apparatus of claim 1, wherein the control circuit is further configured to cause the apparatus to:
  receive a fourth command to write a first set of data to a partition of the memory die, wherein the internal read operation is performed to determine the data of the codeword written to the partition of the memory die; and
  determine a subset of bits that is different between the first set of data and the data of the codeword, wherein writing the information to the memory die comprises overwriting the subset of bits at the partition of the memory die.

8. The apparatus of claim 1, wherein the control circuit is further configured to cause the apparatus to:
  perform a copyback operation on the data of the codeword, wherein the internal read operation is performed to determine the data of the codeword written to a first partition of the memory die and writing the information to the memory die comprises writing the data of the codeword to a second partition of the memory die.

9. The apparatus of claim 1, wherein the internal read operation comprises at least a portion of a copyback operation, a garbage collection operation, a write operation of a multiple-level memory cell, an iterative write operation, or a combination thereof.

10. The apparatus of claim 1, wherein the control circuit is further configured to cause the apparatus to:
  store, in a first portion of the memory die, a set of data bits corresponding to the data of the codeword; and
  store, in a second portion of the memory die, the set of parity bits of the codeword, wherein the set of parity bits is based at least in part on the set of data bits.

11. The apparatus of claim 1, wherein the control circuit is further configured to cause the apparatus to:
  refrain from sending the codeword to a controller of a memory system comprising the memory die as part of the internal read operation.

12. The apparatus of claim 1, wherein the first error control operation and the second error control operation use a same Galois Field primitive polynomial and operate on a same codeword size.

13. The apparatus of claim 1, wherein the codeword comprises a Bose-Chaudhuri-Hocquenghem (BCH) codeword or a Reed-Solomon codeword.

14. An apparatus, comprising:
  a memory die; and
  a control circuit coupled with the memory die and configured to cause the apparatus to:
    retrieve, from the memory die, a codeword as part of an internal read operation that is initiated independent of a read command received from a host system, the codeword comprising data and a set of parity bits;
    identify, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits;
    correct the one or more errors in the data of the codeword based at least in part on identifying the one or more errors;
    write, to the memory die, information based at least in part on correcting the one or more errors in the data of the codeword;
    receive, from the host system, a first command to read the data of the codeword from the memory die;
    retrieve, from the memory die, the codeword as part of a read operation in response to receiving the first command to read the data;
    identify, by the second error control operation implemented by a second error control circuit, one or more second errors in the data of the codeword using the set of parity bits; and
    transmit the data of the codeword to the host system based at least in part on identifying the one or more second errors.

15. The apparatus of claim 14, wherein the control circuit is further configured to cause the apparatus to:

refrain from performing the first error control operation on the codeword using the first error control circuit in response to receiving the first command to read the data.

16. The apparatus of claim 14, wherein the control circuit is further configured to cause the apparatus to:
refrain from correcting errors in the data of the codeword using the first error control circuit in response to the first command to read the data; and
correct the one or more second errors in the data of the codeword based at least in part on identifying the one or more second errors using the second error control circuit, wherein transmitting the data of the codeword is based at least in part on correcting the one or more second errors.

17. A non-transitory computer-readable medium storing code comprising instructions which, when executed by a processor of an electronic device, cause the electronic device to:
retrieve, from a memory die, a codeword as part of an internal read operation that is initiated independent of a read command received from a host system, the codeword comprising data and a set of parity bits;
identify, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits, the second error control operation implemented by a second error control circuit;
correct the one or more errors in the data of the codeword based at least in part on identifying the one or more errors; and
write, to the memory die, information based at least in part on correcting the one or more errors in the data of the codeword.

18. A non-transitory computer-readable medium storing code comprising instructions which, when executed by a processor of an electronic device, cause the electronic device to:
retrieve, from a memory die, a codeword as part of an internal read operation that is initiated independent of a read command received from a host system, the codeword comprising data and a set of parity bits;
identify, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits;
correct the one or more errors in the data of the codeword based at least in part on identifying the one or more errors;
write, to the memory die, information based at least in part on correcting the one or more errors in the data of the codeword;
receive, from the host system, a first command to read the data of the codeword from the memory die;
retrieve, from the memory die, the codeword as part of a read operation in response to receiving the first command to read the data;
identify, by the second error control operation implemented by a second error control circuit, one or more second errors in the data of the codeword using the set of parity bits; and
transmit the data of the codeword to the host system based at least in part on identifying the one or more second errors.

19. The non-transitory computer-readable medium of claim 18, wherein the instructions, when executed by the processor of the electronic device, further cause the electronic device to:
refrain from performing the first error control operation on the codeword using the first error control circuit in response to receiving the first command to read the data.

20. The non-transitory computer-readable medium of claim 18, wherein the instructions, when executed by the processor of the electronic device, further cause the electronic device to:
refrain from correcting errors in the data of the codeword using the first error control circuit in response to the first command to read the data; and
correct the one or more second errors in the data of the codeword based at least in part on identifying the one or more second errors using the second error control circuit, wherein transmitting the data of the codeword is based at least in part on correcting the one or more second errors.

21. A method performed by a memory device, the method comprising:
retrieving, from a memory die, a codeword as part of an internal read operation that is initiated independent of a read command received from a host system, the codeword comprising data and a set of parity bits;
identifying, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits, the second error control operation implemented by a second error control circuit;
correcting the one or more errors in the data of the codeword based at least in part on identifying the one or more errors; and
writing, to the memory die, information based at least in part on correcting the one or more errors in the data of the codeword.

22. A method performed by a memory device, the method comprising:
retrieving, from a memory die, a codeword as part of an internal read operation that is initiated independent of a read command received from a host system, the codeword comprising data and a set of parity bits;
identifying, by a first error control operation supporting detection of a first quantity of errors and implemented by a first error control circuit on the memory die, one or more errors in the data of the codeword using the set of parity bits, wherein the codeword is also configured for use by a second error control operation that supports detection of a second quantity of errors greater than the first quantity of errors using the set of parity bits;
correcting the one or more errors in the data of the codeword based at least in part on identifying the one or more errors;

writing, to the memory die, information based at least in part on correcting the one or more errors in the data of the codeword;

receiving, from the host system, a first command to read the data of the codeword from the memory die;

retrieving, from the memory die, the codeword as part of a read operation in response to receiving the first command to read the data;

identifying, by the second error control operation implemented by a second error control circuit, one or more second errors in the data of the codeword using the set of parity bits; and transmitting the data of the codeword to the host system based at least in part on identifying the one or more second errors.

23. The method of claim 22, further comprising:

refraining from performing the first error control operation on the codeword using the first error control circuit in response to receiving the first command to read the data.

24. The method of claim 22, further comprising:

refraining from correcting errors in the data of the codeword using the first error control circuit in response to the first command to read the data; and correcting the one or more second errors in the data of the codeword based at least in part on identifying the one or more second errors using the second error control circuit, wherein transmitting the data of the codeword is based at least in part on correcting the one or more second errors.

* * * * *